(12) United States Patent
Dutta et al.

(10) Patent No.: US 11,227,997 B1
(45) Date of Patent: Jan. 18, 2022

(54) PLANAR RESISTIVE RANDOM-ACCESS MEMORY (RRAM) DEVICE WITH A SHARED TOP ELECTRODE

(71) Applicant: International Business Machines Corporation, Armonk, NY (US)

(72) Inventors: Ashim Dutta, Menands, NY (US); Saumya Sharma, Easton, CT (US); Tianji Zhou, Albany, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/922,049

(22) Filed: Jul. 7, 2020

(51) Int. Cl.
*H01L 45/00* (2006.01)
*H01L 27/24* (2006.01)

(52) U.S. Cl.
CPC ...... *H01L 45/1691* (2013.01); *H01L 27/2463* (2013.01); *H01L 45/08* (2013.01); *H01L 45/1233* (2013.01); *H01L 45/1253* (2013.01); *H01L 45/146* (2013.01)

(58) Field of Classification Search
CPC ............. H01L 45/1691; H01L 27/2463; H01L 45/1233; H01L 45/1253
See application file for complete search history.

(56) References Cited

U.S. PATENT DOCUMENTS

| 7,659,534 | B2 | 2/2010 | Chen et al. |
| 7,791,925 | B2 | 9/2010 | Li et al. |
| 8,598,011 | B2 | 12/2013 | Song et al. |
| 9,076,518 | B2 | 7/2015 | Scheuerlein et al. |
| 9,142,767 | B2 | 9/2015 | Wells et al. |
| 9,257,641 | B2 | 2/2016 | Chen et al. |
| 9,362,496 | B2 | 6/2016 | Walls et al. |
| 9,985,205 | B2 | 5/2018 | Arayashiki |
| 2009/0302315 | A1 | 12/2009 | Lee et al. |
| 2014/0353569 | A1* | 12/2014 | Lee ............... H01L 45/1246 257/4 |
| 2017/0077398 | A1* | 3/2017 | Arayashiki ...... H01L 45/145 |
| 2017/0263457 | A1 | 9/2017 | El-Ghoroury et al. |

\* cited by examiner

*Primary Examiner* — Shih Tsun A Chou
(74) *Attorney, Agent, or Firm* — Cantor Colburn LLP; L. Jeffrey Kelly

(57) ABSTRACT

Embodiments of the present invention are directed to forming a planar Resistive Random Access Memory (RRAM) device with a shared top electrode. In a non-limiting embodiment of the invention, a first trench having a first width and a second trench having a second width less than the first width are formed in a dielectric layer. A bottom liner is formed on sidewalls of the first trench. The bottom liner pinches off the second trench. A top liner is formed on sidewalls of the bottom liner in the first trench. The top liner is formed such that a portion of the bottom liner at a bottommost region of the first trench remains exposed. The exposed portion of the bottom liner is removed, and a memory cell material is formed in the first trench.

14 Claims, 9 Drawing Sheets

PLANAR RESISTIVE RANDOM-ACCESS MEMORY (RRAM) DEVICE WITH A SHARED TOP ELECTRODE

BACKGROUND

The present invention generally relates to fabrication methods and resulting structures for semiconductor devices, and more specifically, to forming a planar Resistive Random Access Memory (RRAM) device with a shared top electrode.

As the functionality of integrated chips increases, the need for more memory does as well. For example, analog memory devices (e.g., RRAMs) are now being used to build neuromorphic hardware accelerators for deep learning artificial intelligence (AI) applications. In response, designers have been looking to decrease the size of the memory elements and to stack more memory elements in a unit area to achieve greater capacity and lower costs per bit. With advancements in lithographic techniques, significant shrinkage of memory elements has been achieved. For example, flash memory can achieve high density by using 3D arrays, such as using vertical NAND cell stacking. Due to its high density, flash memory has been widely used as a large-capacity, nonvolatile memory, which can store data when it is powered off. However, it has been found that further miniaturization of the flash memory is limited as production costs have become increasingly high.

Designers are now looking at next generation nonvolatile memories such as MRAMs (Magnetoresistive Random Access Memory), PCRAMs (Phase Change Random Access Memory), CBRAMs (Conductive Bridging Random Access Memory) and RRAMs (Resistive Random Access Memory) to increase writing speed and decrease power consumption. Among the nonvolatile memories, RRAM has potential to replace flash memories due to its simple structure and suitability to low-temperature fabrication. A unit element of the RRAM is a two-terminal device having an insulator positioned between two metal electrodes. For example, a memristor element (e.g., HfOx) can be sandwiched between two electrodes. Defects (e.g., oxygen vacancies) are intentionally introduced in the memristor film so that the memristor can be programmed to different logic states, such as a low-resistance state (logic "1") or a high-resistance state (logic "0"), by changing the polarity of an electrical field across the memristor element.

SUMMARY

Embodiments of the invention are directed to a method for forming a planar RRAM device with a shared top electrode. A non-limiting example of the method includes forming a first trench having a first width and a second trench having a second width less than the first width in a dielectric layer. A bottom liner is formed on sidewalls of the first trench. The bottom liner pinches off the second trench. A top liner is formed on sidewalls of the bottom liner in the first trench. The top liner is formed such that a portion of the bottom liner at a bottommost region of the first trench remains exposed. The exposed portion of the bottom liner is removed, and a memory cell material is formed in the first trench.

Embodiments of the invention are directed to a semiconductor structure. A non-limiting example of the semiconductor device includes a bottom electrode contact and a bottom liner having a first portion and a second portion. The first portion includes a pinched off region in a first trench on the bottom electrode contact. The second portion is positioned on sidewalls of a second trench. A top liner is formed on sidewalls of the bottom liner in the second trench. The top liner is positioned such that a bottommost region of the second trench remains exposed. A top electrode contact is formed on the top liner and a memory cell material is formed in the second trench.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
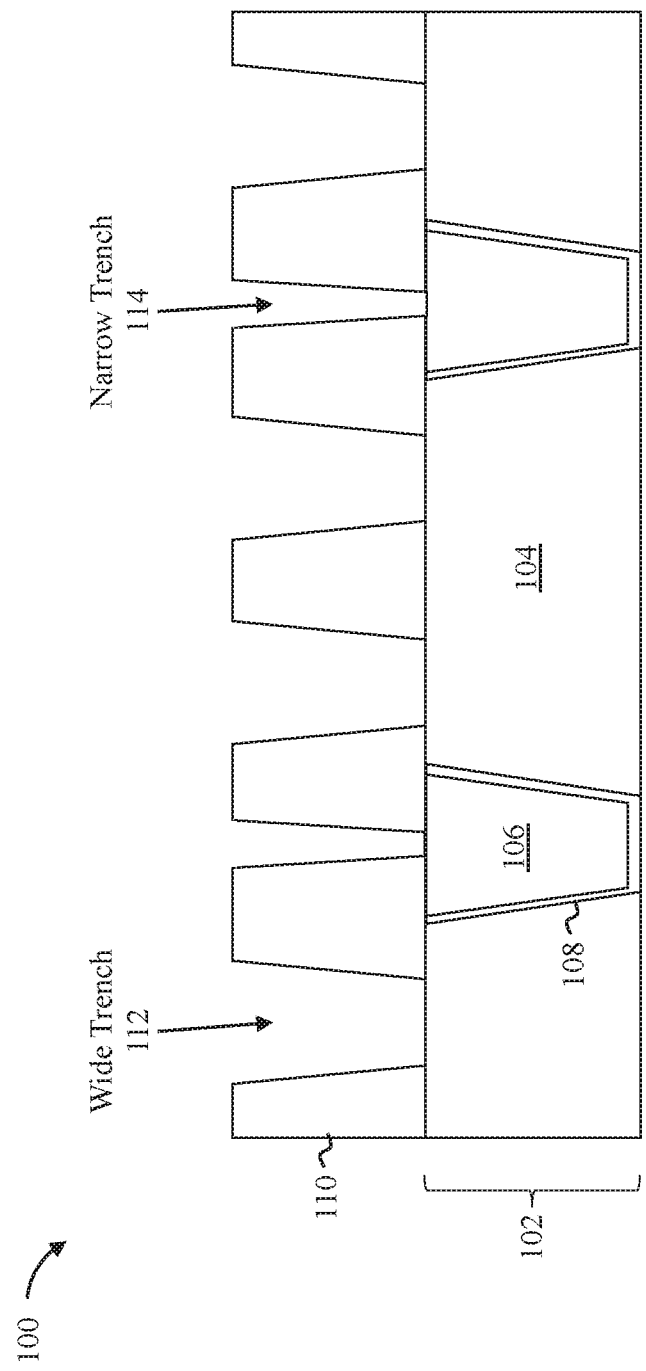
FIG. 1 depicts a cross-sectional view of a semiconductor structure after an initial set of processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as next generation nonvolatile memories such as the RRAM continue to scale, device tolerances and critical dimensions continue to shrink. Scaling RRAM architectures to satisfy these tolerance and critical dimension requirements is challenging. Current planar RRAM architectures do not achieve sub 30 nm footprints. Nonplanar (e.g., Cross-point) RRAM architectures can provide footprints below 30 nm but require multiple RRAM material etches (at least one in each direction) which increases the risk of etch damage to the RRAM material. Damage to the RRAM material degrades the RRAM stack and reduces the performance of the final device.

Turning now to an overview of aspects of the present invention, one or more embodiments of the invention address the above-described shortcomings of the prior art by providing a planar RRAM device having a shared top electrode contact and a method for forming the planar RRAM device. A planar RRAM architecture formed in accordance with one or more embodiments allows for sub 30 nm scaling without the need for multiple RRAM material etches, reducing etch damage to the RRAM material.

The planar RRAM device is built from an array of trenches constructed such that some of the trenches have a relatively wide critical dimension (CD) while other trenches have a relatively small CD. A bottom liner is conformally deposited over the trenches to form the electrodes of an RRAM cell. The large and small trench CDs are selected such that an adhesive zipping force will cause the small CD trenches to pinch off while still allowing the bottom liner to coat the larger CD trenches. In other words, zipping (pinch off) can be intentionally produced for certain trenches by making their lithographic CD smaller, while allowing relatively larger CD trenches to remain open.

A top liner is deposited over the bottom liner using a non-conformal process. Due to the small CD pinch off, the top liner cannot coat the sidewalls of the small CD trenches. Instead, the top liner only covers sidewalls of the larger CD trenches, leaving the portion of the bottom liner at the bottom of the larger CD trenches exposed. The exposed bottom portions of the bottom liner are removed selective to the top liner. In some embodiments of the invention, the top liner can be a metal containing conducting material that has good selectivity to wet etch chemistry used for removing the bottom liner. For example, if the bottom liner material is TaN, the top liner can be Ti, TiN, or Ru. In another example, if the bottom liner is TiN, then the top liner can be TaN, Ta, or Ru. RRAM cell material is then deposited within the larger CD trenches and memory cells are formed by patterning (cutting) the trenches.

Advantageously, a planar RRAM formed in this manner can be used as a standalone memory and can be readily incorporated within an AI hardware application. Moreover, the cell area of such a device can be increased without increasing the effective cell size in the horizontal direction, allowing further increases in cell area at the same technology node (see FIG. 8).

Turning now to a more detailed description of aspects of the present invention, FIGS. 1-8 depict a semiconductor structure 100 after various fabrication operations in accordance with aspects of the invention. Although the cross-sectional diagrams depicted in FIGS. 1-8 are two-dimensional, it is understood that the diagrams depicted in FIGS. 1-8 represent three-dimensional structures.

FIG. 1 depicts a cross-sectional view of the semiconductor structure 100 during an intermediate operation of a method of fabricating a final semiconductor device according to one or more embodiments of the invention. In the embodiment shown in FIG. 1, the semiconductor structure 100 includes a bottom electrode layer 102 having an inter-level dielectric (ILD) 104 and one or more bottom electrode contacts 106.

In some embodiments of the invention, the ILD 104 is a layer positioned within a back-end-of-line (BEOL) metallization stack (not depicted). The ILD 104 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the ILD 104 can be utilized, such as, for example, chemical vapor deposition (CVD), plasma-enhanced CVD (PECVD), atomic layer deposition (ALD), flowable CVD, spin-on dielectrics, or physical vapor deposition (PVD).

The bottom electrode contacts 106 can be made of any suitable material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the bottom electrode contacts 106 include a metal nitride (e.g., titanium nitride (TiN) or tantalum nitride (TaN)) or a metal (e.g., titanium (Ti) or tantalum (Ta)). In some embodiments of the invention, the bottom electrode contacts 106 includes TiN. In some embodiments of the invention, the bottom electrode contacts 106 is formed to a width of 20 nm, although other widths are within the contemplated scope of the invention. The conductive material can further include dopants that are incorporated during or after deposition. In some embodiments of the invention, the bottom electrode contacts 106 can include a barrier liner 108. Material examples for a barrier liner include tantalum nitride and tantalum (TaN and Ta), titanium, titanium nitride, cobalt, ruthenium, and manganese.

In some embodiments of the invention, a dielectric layer 110 is formed on the bottom electrode layer 102. The dielectric layer 110 can be formed using any suitable dielectric material. In some embodiments of the invention, the dielectric layer 110 is made of a same dielectric material as the ILD 104. Any known manner of forming the dielectric layer 110 can be utilized, such as, for example, CVD, PECVD, ALD, spin-on dielectrics, or PVD.

As shown in FIG. 1, one or more wide trenches 112 and one or more narrow trenches 114 can be formed in the dielectric layer 110. As discussed previously, the CD (i.e., width) of the trenches 112, 114 can be selected to ensure pinch off of the narrow trenches 114 without causing pinch off of the wide trenches 112. In some embodiments of the invention, the width of the wide trenches 112 is greater than 10 nm and the width of the narrow trenches 114 is less than 10 nm, although other widths are within the contemplated scope of the invention. In some embodiments of the invention, the width of the narrow trenches 114 is 90%, 80%, 60%, 40%, 20%, or 10% the width of the wide trenches 112. In some embodiments of the invention, the pitch of the trenches 112, 114 is 20 nm or more, although other trench pitches are within the contemplated scope of the invention. In some embodiments of the invention, the depth of the trenches 112, 114 is 30 nm or more, although other trench depths are within the contemplated scope of the invention. The trenches 112, 114 can be patterned using any suitable process, such as, for example, the self-aligned litho-etch litho-etch (SALELE) process.

Figure 2:
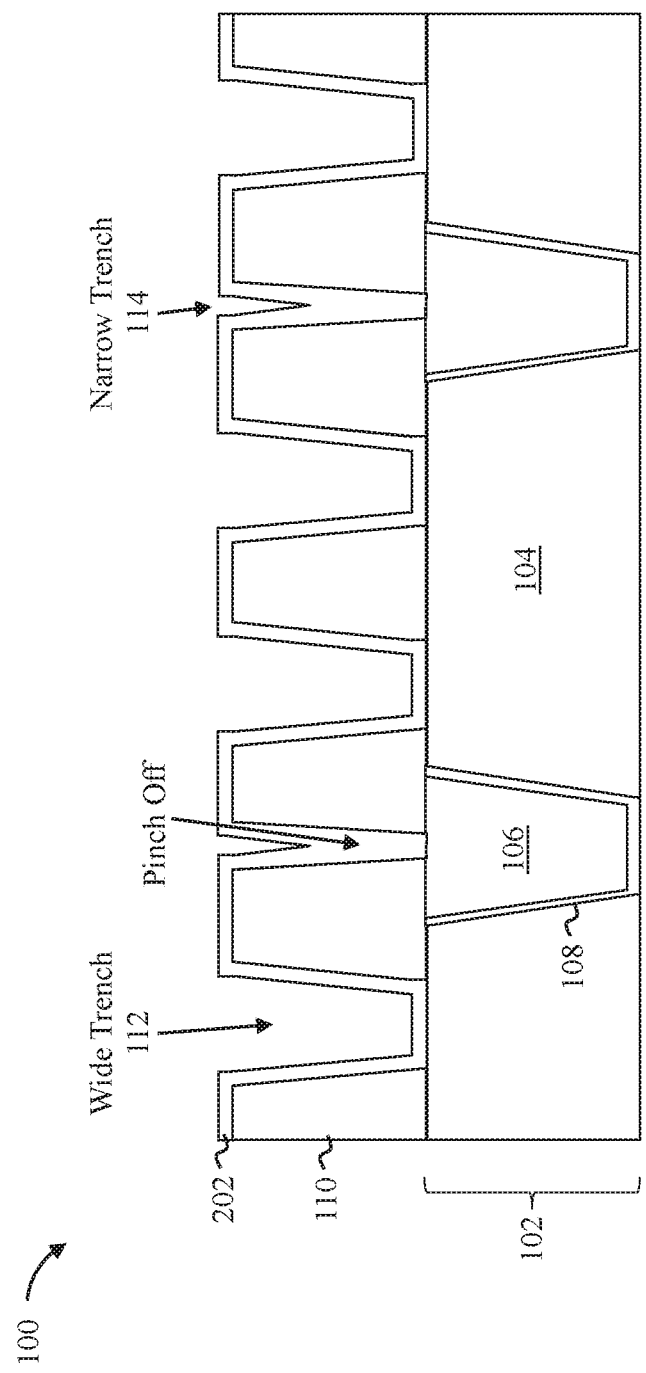
FIG. 2 depicts a cross-sectional view of the semiconductor structure after a processing operation according to one or more embodiments of the invention.
Figure 8:
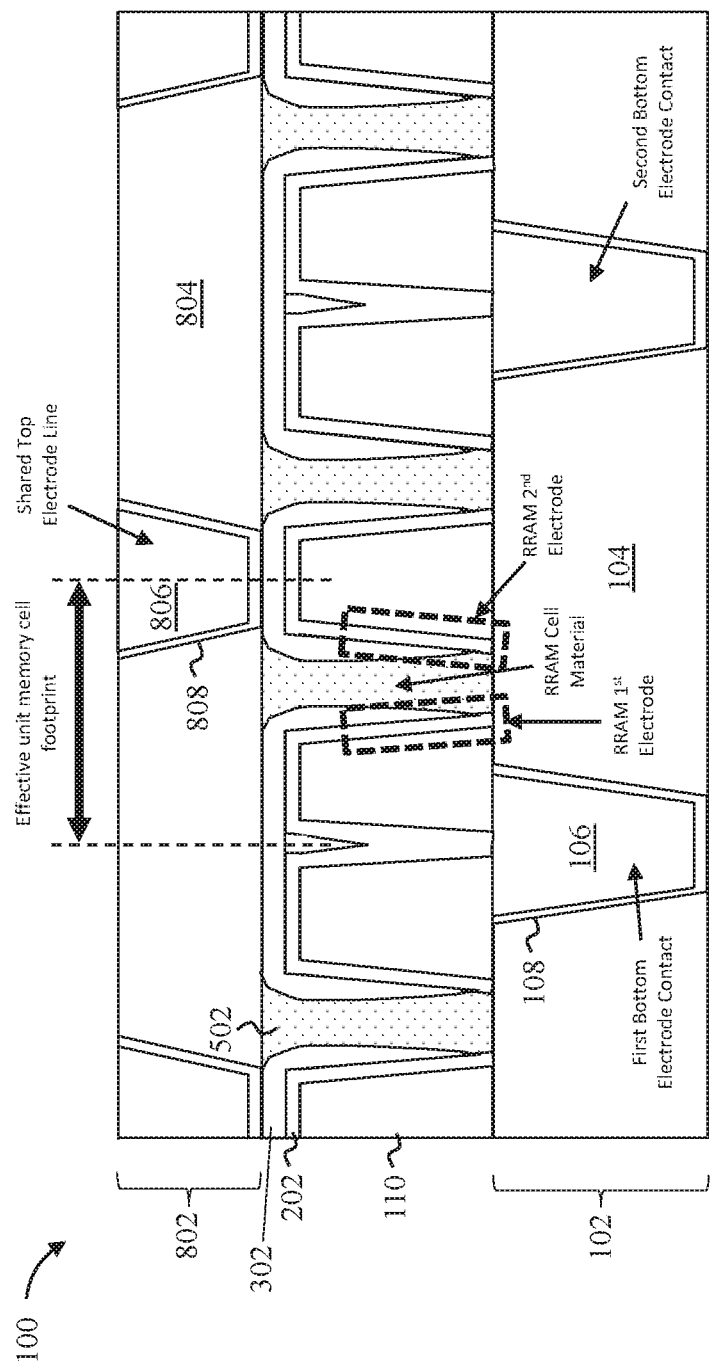
FIG. 8 depicts a cross-sectional view of the semiconductor structure according to one or more embodiments of the invention.

FIG. 2 depicts a cross-sectional view of the semiconductor structure 100 after a processing operation according to one or more embodiments of the invention. As illustrated in FIG. 2, a bottom liner 202 is deposited or formed over the semiconductor structure 100. In some embodiments of the invention, the bottom liner 202 is a conductive liner deposited using a conformal process. In some embodiments of the invention, the bottom liner 202 is a metal nitride (e.g., TaN, TiN, etc.) deposited using a conformal process such as, for example, ALD, PEALD, etc. The bottom liner 202 ultimately defines, after patterning, RRAM cell electrodes in the wide trenches 112 (FIG. 8). As further shown in FIG. 2, in some embodiments of the invention, an adhesive zipping force will cause the narrow trenches 114 to pinch off.

Figure 3:
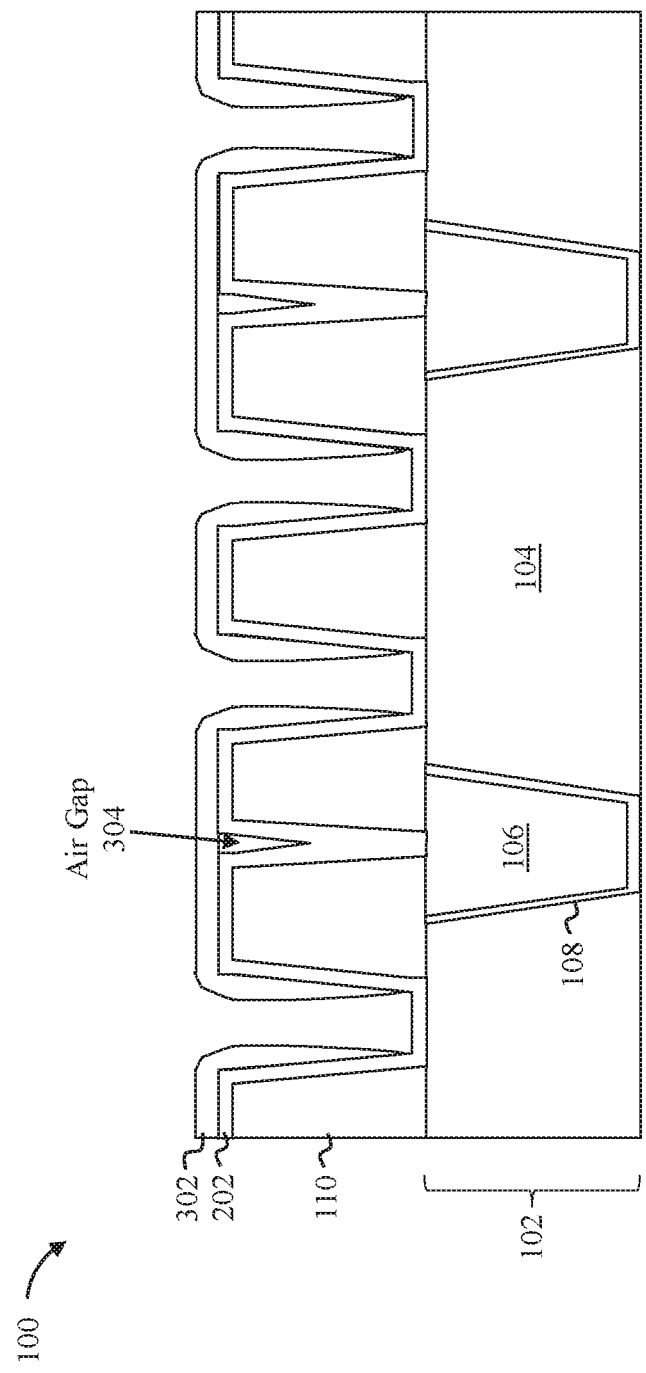
FIG. 3 depicts a cross-sectional view of the semiconductor structure after a processing operation according to one or more embodiments of the invention.

FIG. 3 depicts a cross-sectional view of the semiconductor structure 100 after a processing operation according to one or more embodiments of the invention. As illustrated in FIG. 3, a top liner 302 is deposited or formed over the bottom liner 202. In some embodiments of the invention, the top liner 302 is a conductive metal (e.g., Ti, Ru), metal nitride (e.g., TaN), or metal oxide (e.g., ZnO) deposited using a non-conformal process. For example, in some embodiments of the invention, the top liner 302 is TaN or Ru deposited using PVD.

As further shown in FIG. 3, the larger CD of the wide trenches 112 allows for the non-conformal deposition of the top liner 302 to coat (line) the sidewalls of the wide trenches 112. In some embodiments of the invention, a bottommost surface of the wide trenches 112 remains exposed. In other words, a portion of the bottom liner 202 remains exposed after depositing the top liner 202. In some embodiments of the invention, the top liner 302 does not fill the narrow trench 114 due to pinch off of the bottom liner 202, resulting in an air gap 304 within the narrow trench 114. In other embodiments of the invention, the top liner 302 fills the remaining portions of the narrow trench 114 (not shown).

Figure 4:
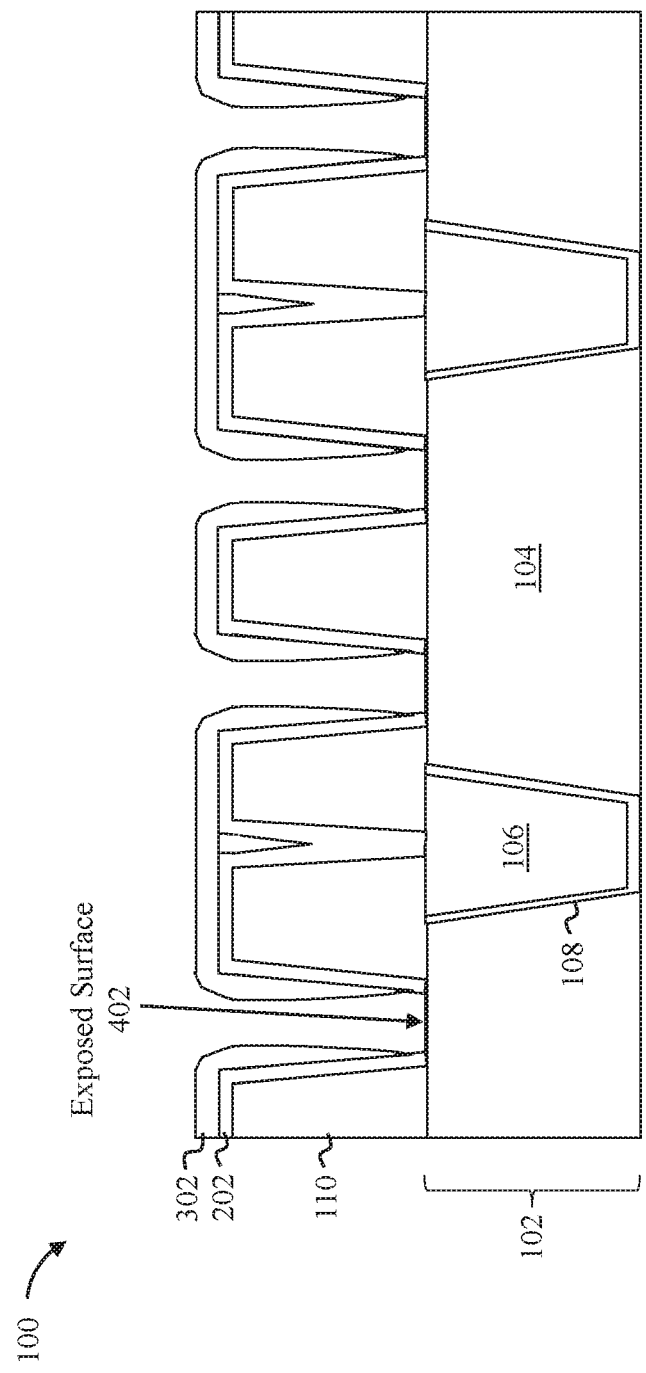
FIG. 4 depicts a cross-sectional view of the semiconductor structure after a processing operation according to one or more embodiments of the invention.

FIG. 4 depicts a cross-sectional view of the semiconductor structure 100 after a processing operation according to one or more embodiments of the invention. As illustrated in FIG. 4, the exposed portions of the bottom liner 202 (i.e., those portions not covered by the top liner 302) can be removed to expose a surface 402 of the bottom electrode layer 102. The exposed portions of the bottom liner 202 can be removed using, for example, a wet etch, a dry etch, or a combination of wet and/or dry etches.

In some embodiments of the invention, the exposed portions of the bottom liner 202 are removed using a wet etch selective to the top liner 302. As discussed previously herein, the material for the top liner 302 can be selected to ensure wet etch chemistry selectivity during the removal of the bottom liner 202. For example, if the bottom liner 202 is TaN or TiN and the top liner 302 is TiN or TaN, respectively, the exposed portions of the bottom liner 202 can be removed using an etchant having one or more of the following elements or functional groups: carboxyl or amine functional groups, glycine, oxalic acid, citric acid, hydrofluoric acid, sulfuric acid, hydrogen chloride, nitric acid, a compound having azole, triazole, and/or peroxy functional groups, and alkaline metal hydroxides.

Figure 5:
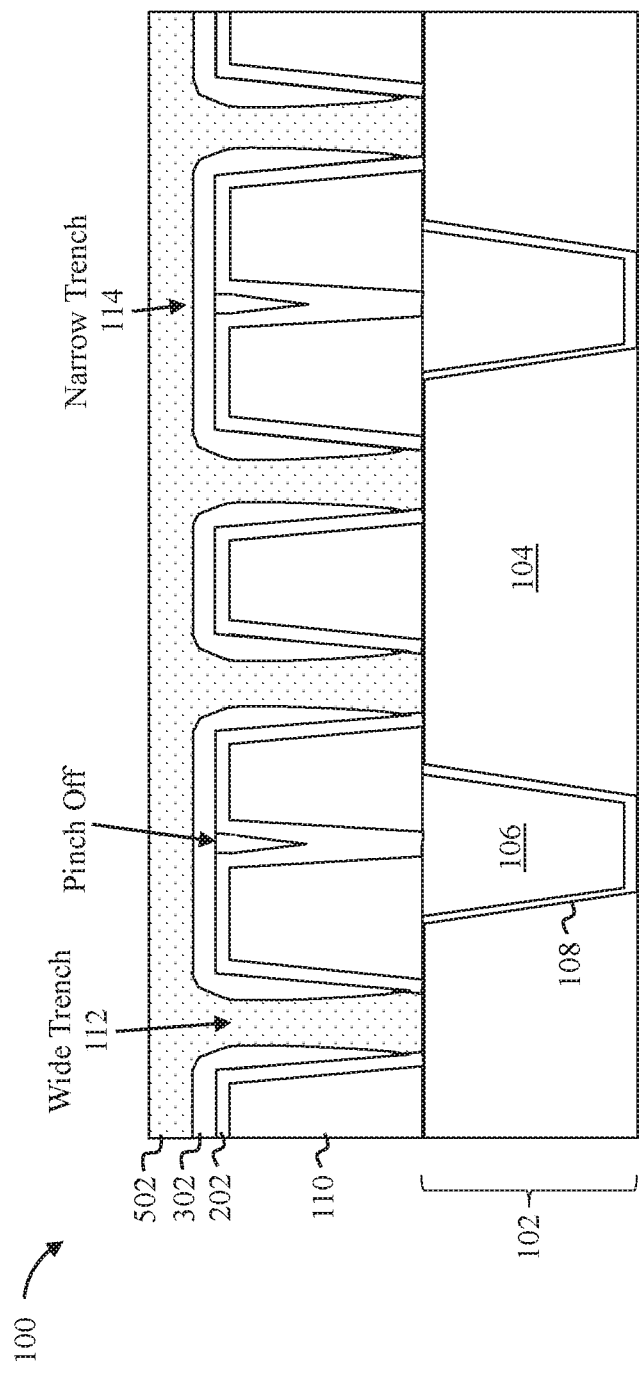
FIG. 5 depicts a cross-sectional view of the semiconductor structure after a processing operation according to one or more embodiments of the invention.

FIG. 5 depicts a cross-sectional view of the semiconductor structure 100 after a processing operation according to one or more embodiments of the invention. As illustrated in FIG. 5, RRAM cell material 502 is deposited over the semiconductor structure 100. In some embodiments of the invention, the RRAM cell material 502 fills remaining portions of the wide trench 112 but is blocked from filling the narrow trench 114 due to pinch off. The RRAM cell material 502 can be made of any suitable cell material, such as, for example, $CuO_x$, $NiO_x$, $CoO_x$, $ZnO_x$, $CrO_x$, $TiO_x$, $HfO_x$, $ZrO$, $FeO_x$ and $NbO_x$. The RRAM cell material 502 can be formed or deposited using any suitable process, such as, for example, PVD.

Figure 6:
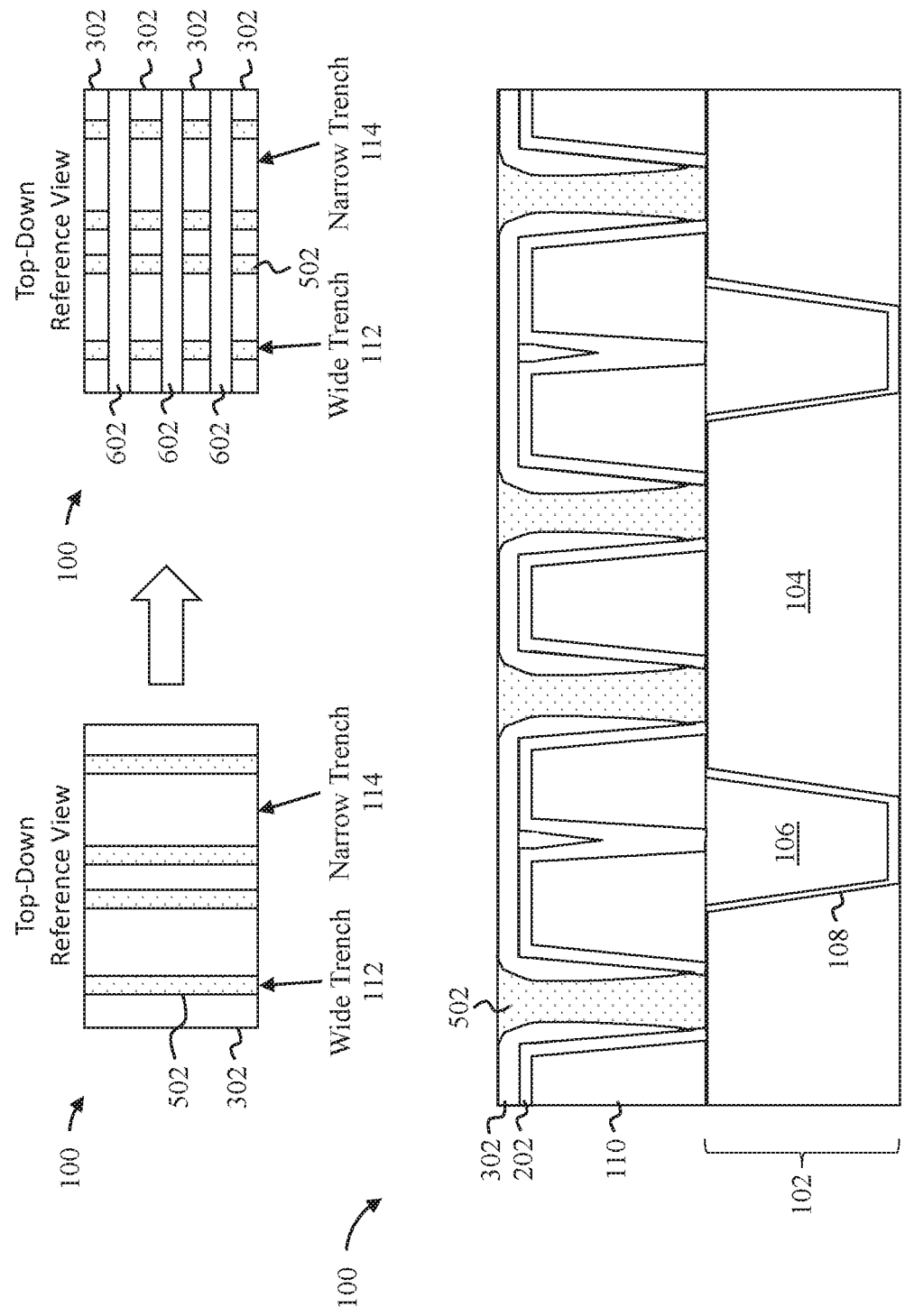
FIG. 6 depicts top-down reference views and a cross-sectional view of the semiconductor structure according to one or more embodiments of the invention.

FIG. 6 depicts a cross-sectional view and top-down reference views of the semiconductor structure 100 after a processing operation according to one or more embodiments of the invention. As illustrated in FIG. 6, the RRAM cell material 502 can be planarized to a surface of the top liner 302 (to the top of the wide trenches 112), using, for example, chemical-mechanical planarization (CMP). As shown in the top-down reference view, the RRAM cell material 502 fills the channels defined by the wide trenches 112 but does not fill the channels defined by the narrow trenches 114. As further shown in the top-down reference view of FIG. 6, in some embodiments of the invention, isolation trenches 602 can be formed in the semiconductor structure 100 in a direction orthogonal to the trenches 112, 114.

Figure 7:
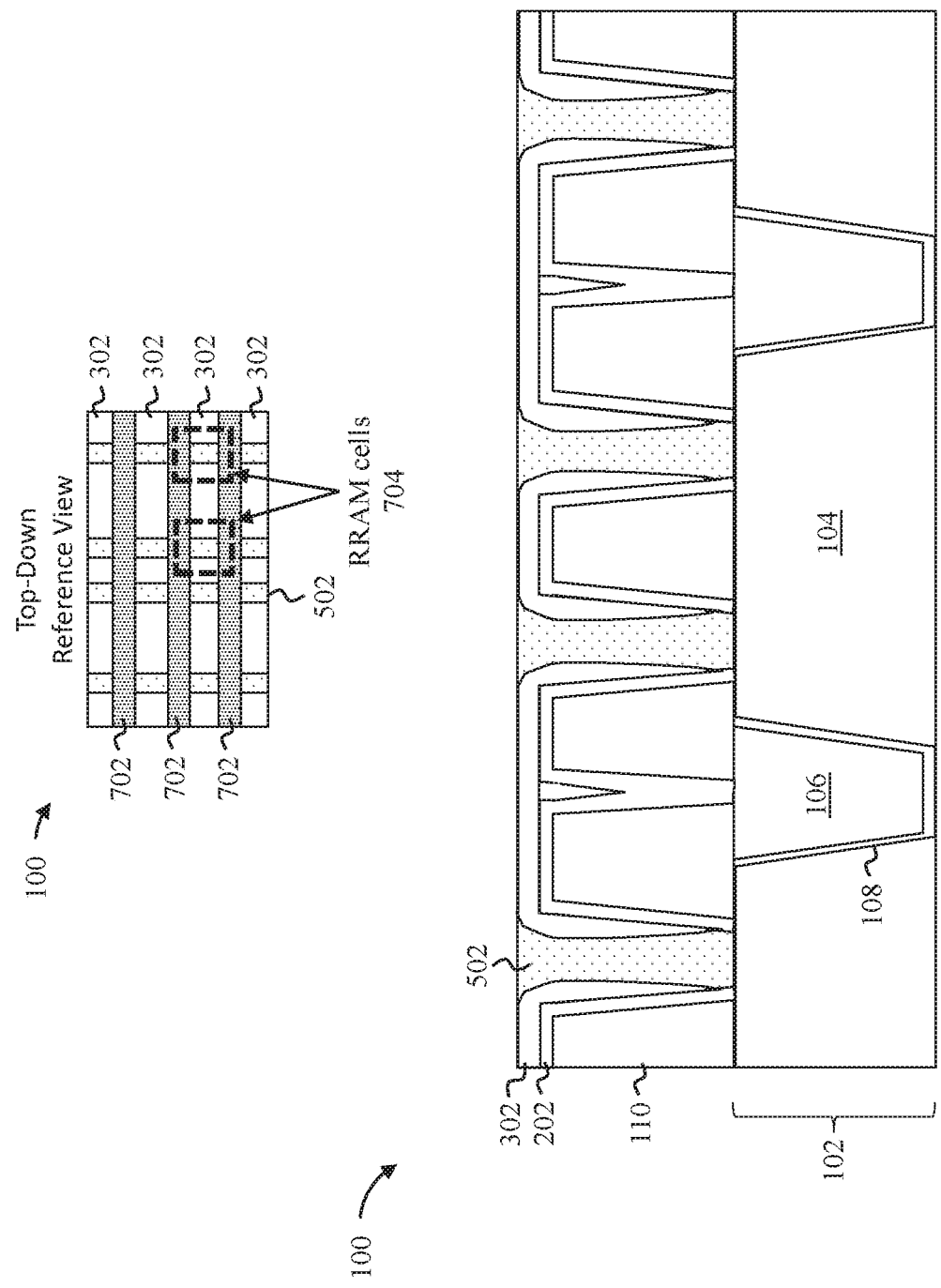
FIG. 7 depicts a top-down reference view and a cross-sectional view of the semiconductor structure according to one or more embodiments of the invention.

FIG. 7 depicts a cross-sectional view and a top-down reference view of the semiconductor structure 100 after a processing operation according to one or more embodiments of the invention. As illustrated in FIG. 7, the isolation trenches 602 can be filled with an isolation dielectric 702 to define one or more RRAM cells 704 (i.e., the isolated portions of the RRAM cell material 502). The isolation dielectric 702 can be formed using any suitable dielectric material. In some embodiments of the invention, the isolation dielectric 702 is made of a same dielectric material as the ILD 104. Any known manner of forming the isolation dielectric 702 can be utilized, such as, for example, CVD, PECVD, ALD, spin-on dielectrics, or PVD.

FIG. 8 depicts a cross-sectional view of the semiconductor structure 100 after a processing operation according to one or more embodiments of the invention. As illustrated in FIG. 8, a top electrode layer 802 having an ILD 804 and one or more top electrode lines 806 (also referred to as a top electrode contact) is formed on the semiconductor structure 100.

The ILD 804 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the ILD 804 can be utilized, such as, for example, CVD, PECVD, ALD, flowable CVD, spin-on dielectrics, or PVD.

The top electrode lines 806 can be made of any suitable material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the top electrode lines 806 include a metal nitride (e.g., titanium nitride (TiN) or tantalum nitride (TaN)) or a metal (e.g., titanium (Ti) or tantalum (Ta)). In some embodiments of the invention, the top electrode lines 806 includes TiN. In some embodiments of the invention, the top electrode lines 806 are formed to a width of 20 nm, although other widths are within the contemplated scope of the invention. The conductive material can further include dopants that are incorporated during or after deposition. In some embodiments of the invention, the top electrode lines 806 can include a barrier liner 808. Material examples for a barrier liner include tantalum nitride and tantalum (TaN and Ta), titanium, titanium nitride, cobalt, ruthenium, and manganese.

In some embodiments of the invention, the top electrode lines 806 and the bottom electrode contacts 106 are made of a same metal or metal nitride. In some embodiments of the invention, the top electrode lines 806 are made of a first metal or metal nitride and the bottom electrode contacts 106 are made of a second metal or metal nitride. In some embodiments of the invention, the top electrode lines 806 are formed to a thickness of 5-100 nm, although other thicknesses are within the contemplated scope of the invention.

As further shown in FIG. 8, each of the RRAM cells 704 (illustrated in FIG. 7) includes a memory stack having a bottom electrode contact (e.g., the bottom electrode contacts 106), a first electrode (e.g., a first portion of the bottom liner 202), RRAM cell material (e.g., RRAM cell material 502), a second electrode (e.g., a second portion of the bottom liner 202), and a top electrode line (e.g., top electrode lines 806). As depicted in FIG. 8, in some embodiments of the invention, two adjacent RRAM cells have separate bottom contacts but share a common top electrode. As further shown in FIG. 8, the effective unit memory cell footprint is defined by the centerline-to-centerline pitch between a narrow trench 114 and an adjacent wide trench 112. Due to this construction, the cell area can be increased without increasing the effective cell size in the horizontal direction (i.e., in the direction of the trenches 112, 114).

Figure 9:
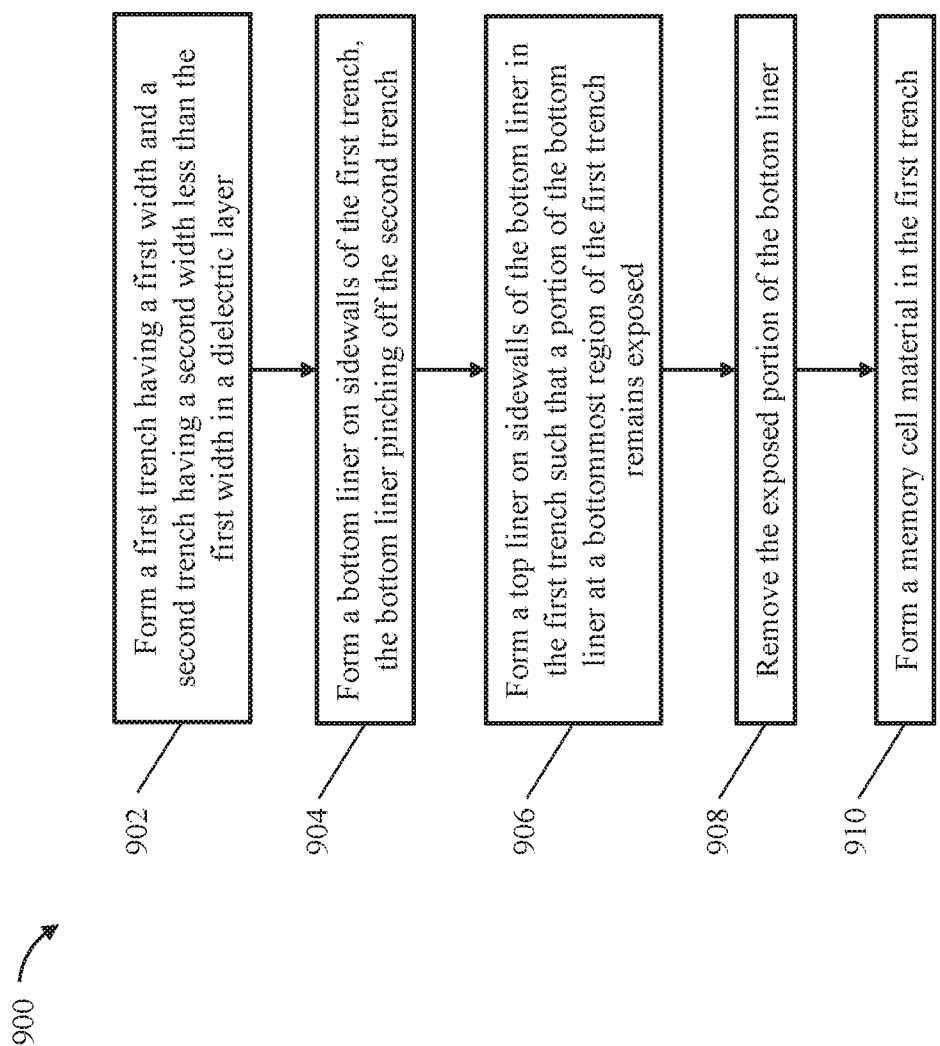
FIG. 9 depicts a flow diagram illustrating a method according to one or more embodiments of the invention.

FIG. 9 depicts a flow diagram 900 illustrating a method for forming a semiconductor device according to one or more embodiments of the invention. As shown at block 902, a first trench having a first width and a second trench having a second width less than the first width are formed in a dielectric layer. In some embodiments of the invention, the first width is more than 10 nm and the second width is less than 10 nm.

At block 904, a bottom liner is formed on sidewalls of the first trench. In some embodiments of the invention, the bottom liner pinches off the second trench. In some embodiments of the invention, the bottom liner is formed using a conformal process that deposits material on the sidewalls of the first trench but not the bottom surface of the first trench. In some embodiments of the invention, the bottom liner includes a first portion and a second portion. The first portion can include a pinched off region in the second trench (the narrow trench) on the bottom electrode contact. The second portion can be positioned on sidewalls of the first trench (the wide trench).

At block 906, a top liner is formed on sidewalls of the bottom liner in the first trench. The top liner can be formed such that a portion of the bottom liner at a bottommost region of the first trench remains exposed. In some embodiments of the invention, top liner does not fill the second trench due to pinch off. In some embodiments of the invention, an air gap is formed between the top liner and the bottom liner in the second trench. In some embodiments of the invention, the top liner is formed using a non-conformal process on the bottom liner.

At block 908, the exposed portion of the bottom liner is removed. In some embodiments of the invention, removing the exposed portion of the bottom liner includes etching the bottom liner selective to the top liner. In some embodiments of the invention, the top liner includes a conductive material having etch selectivity with respect to a wet etch chemistry used to remove the exposed portion of the bottom liner. In some embodiments of the invention, the bottom liner includes TiN and the top liner includes TaN or Ru. In some embodiments of the invention, the bottom liner includes TaN and the top liner includes TiN or Ru.

At block 910, a memory cell material is formed in the first trench. In some embodiments of the invention, the memory cell material includes one or more of CuOx, NiOx, CoOx, ZnOx, CrOx, TiOx, HfOx, ZrO, FeOx and NbOx.

The method can further include forming a bottom electrode contact electrically coupled to a pinched off portion of the bottom liner. In some embodiments of the invention, a shared top electrode contact is electrically coupled to the top liner. In some embodiments of the invention, one or more isolation trenches are formed in a direction orthogonal to the first trench and the second trench to define one or more RRAM cells. In some embodiments of the invention, the shared top electrode contact includes a shared top electrode for a first RRAM cell and a second RRAM cell.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:

forming a first trench having a first width and a second trench having a second width less than the first width in a dielectric layer;

forming a bottom liner on sidewalls of the first trench, the bottom liner pinching off the second trench;

forming a top liner on sidewalls of the bottom liner in the first trench, the top liner formed such that a portion of the bottom liner at a bottommost region of the first trench remains exposed;

removing the exposed portion of the bottom liner; and forming a memory cell material in the first trench.

2. The method of claim 1, wherein the top liner does not fill the second trench due to pinch off.

3. The method of claim 2, wherein an air gap is formed between the top liner and the bottom liner in the second trench.

4. The method of claim 1, wherein the first width is more than 10 nm and the second width is less than 10 nm.

5. The method of claim 1, wherein removing the exposed portion of the bottom liner comprises etching the bottom liner selectively to the top liner.

6. The method of claim 5, wherein the top liner comprises a conductive material having etch selectivity with respect to a wet etch chemistry used to remove the exposed portion of the bottom liner.

7. The method of claim 6, wherein the bottom liner comprises TiN and the top liner comprises TaN or Ru.

8. The method of claim 6, wherein the bottom liner comprises TaN and the top liner comprises TiN or Ru.

9. The method of claim 1, wherein the memory cell material comprises one or more of $CuO_x$, $NiO_x$, $CoO_x$, $ZnO_x$, $CrO_x$, $TiO_x$, $HfO_x$, $ZrO$, $FeO_x$ and $NbO_x$.

10. The method of claim 1, further comprising forming a bottom electrode contact electrically coupled to a pinched off portion of the bottom liner.

11. The method of claim 10, further comprising forming a shared top electrode contact electrically coupled to the top liner.

12. The method of claim 1, wherein forming the bottom liner comprises conformally depositing the bottom liner on the sidewalls of the first trench.

13. The method of claim 11, wherein forming the top liner comprises non-conformally depositing the top liner on the bottom liner.

14. The method of claim 1, further comprising forming one or more isolation trenches in a direction orthogonal to the first trench and the second trench to define one or more Resistive Random Access Memory (RRAM) cells.

* * * * *